(12) United States Patent
Lu et al.

(10) Patent No.: US 11,469,121 B2
(45) Date of Patent: Oct. 11, 2022

(54) SPIN COATING DEVICE AND METHOD

(71) Applicant: SHANGHAI MICRO ELECTRONICS EQUIPMENT (GROUP) CO., LTD., Shanghai (CN)

(72) Inventors: Shiliang Lu, Shanghai (CN); Hang Ran, Shanghai (CN); Yihui Li, Shanghai (CN); Xiaoping Yan, Shanghai (CN); Jun Zhao, Shanghai (CN); Shanshan Chen, Shanghai (CN)

(73) Assignee: SHANGHAI MICRO ELECTRONICS EQUIPMENT (GROUP) CO., LTD., Shanghai (CN)

(*) Notice: Subject to any disclaimer, the term of this patent is extended or adjusted under 35 U.S.C. 154(b) by 412 days.

(21) Appl. No.: 16/618,309

(22) PCT Filed: May 25, 2018

(86) PCT No.: PCT/CN2018/088498
§ 371 (c)(1),
(2) Date: Nov. 29, 2019

(87) PCT Pub. No.: WO2018/219232
PCT Pub. Date: Dec. 6, 2018

(65) Prior Publication Data
US 2020/0350182 A1    Nov. 5, 2020

(30) Foreign Application Priority Data

May 31, 2017   (CN) .......................... 201710399778.8

(51) Int. Cl.
*H01L 21/67* (2006.01)
*H01L 21/68* (2006.01)
*H01L 21/687* (2006.01)

(52) U.S. Cl.
CPC ...... *H01L 21/6715* (2013.01); *H01L 21/6875* (2013.01)

(58) Field of Classification Search
CPC .................. H01L 21/6715; H01L 21/68714
See application file for complete search history.

(56) References Cited

U.S. PATENT DOCUMENTS 5,916,368 A * 6/1999 Ebert ...................... G03F 7/162
269/21
6,269,548 B1 * 8/2001 Shinozaki ......... H01L 21/68792
92/202

(Continued)

FOREIGN PATENT DOCUMENTS

CN   101681867 A   3/2010
CN   101901776 A   12/2010

(Continued)

*Primary Examiner* — Cachet I Proctor
(74) *Attorney, Agent, or Firm* — Muncy, Geissler, Olds & Lowe, P.C.

(57) ABSTRACT

A spin coating device and method. The spin coating device includes a rotatable rotary shaft and sucker fixed on an end portion of the shaft, and an electromagnetic induction device below the sucker which includes an annular magnet fixed below the sucker, coil group formed by a first and second coil, and strip-shaped magnet fixed at the rotary shaft. A base on the sucker has a notch. The unbalanced centrifugal force during rotation of the sucker causes vibration. The electromagnetic induction device enables the centrifugal force generated during rotation of the sucker to be in balance with the magnetic force generated by the electromagnetic induction device to adjust the levelness of the sucker surface. The device does not need manual manipulation, enables the sucker to be more stable, reduces damage to the equipment due to vibration, and improves the effect of photoresist spin-coating while saving time and labor.

9 Claims, 3 Drawing Sheets

(56) References Cited

U.S. PATENT DOCUMENTS

| | | | | |
|---|---|---|---|---|
| 8,808,798 B2* | 8/2014 | Kitano | ................... | G03F 7/162 |
| | | | | 438/782 |
| 2013/0152971 A1* | 6/2013 | Kato | ................ | H01L 21/68728 |
| | | | | 134/21 |
| 2018/0128782 A1* | 5/2018 | Keeton | ................ | G01N 29/223 |

FOREIGN PATENT DOCUMENTS

| | | | |
|---|---|---|---|
| CN | 104576495 A | | 4/2015 |
| CN | 105436056 A | | 3/2016 |
| CN | 106024692 A | | 10/2016 |
| CN | 106030987 A | | 10/2016 |
| CN | 106168526 A | | 11/2016 |
| JP | 11354617 A | * | 12/1999 |
| JP | H11354617 A | | 12/1999 |
| JP | 2000208591 A | | 7/2000 |
| JP | 2004087934 A | * | 3/2004 |
| JP | 2004087934 A | | 3/2004 |
| JP | 2013229552 A | | 11/2013 |
| WO | WO-2005043608 | | 5/2005 |
| WO | WO-2008041625 A1 | | 4/2008 |

\* cited by examiner

SPIN COATING DEVICE AND METHOD

TECHNICAL FIELD

The present application relates to the field of semiconductor manufacturing devices and, in particular to a spin coating apparatus and method.

BACKGROUND

In the current industry of LED and other IC chip manufacturing, high-speed spin coating is widely used to deposit a photoresist film on a workpiece surface. Micro patterns are then formed in the photoresist film by photolithography and development processes and the film can be served as a protective layer in subsequent processing.

A workpiece with a diameter less than 200 mm used to manufacture a LED chip or other IC chip typically has a so-called "flat" form for alignment. The "flat" form refers to a notch with a flat edge formed by cutting the circular workpiece along a non-diametrical chord thereof. Due to the presence of the flat, a geometric center (GC) of the workpiece does not coincide with its center of gravity (CG).

Consequently, when this workpiece is rotated about its geometric center at a high speed in the photoresist coating and development processes, the deviation between the geometric center and gravitational center will lead to different centrifugal forces in different directions and the resultant unbalanced centrifugal force will be transmitted to the system, commonly the shaft of an electric motor that drives the rotation. This will introduce disturbance and vibration to the system. Vibration is detrimental to the formation of a uniformly thick film in the photoresist coating process, especially when the substrate is heavy. As a particular example, when a 6-inch sapphire substrate with a large deviation between the geometric center and gravitational center is rotated in a spin coating process, it may wobble fiercely and possibly thus break the workpiece or cause damage to the rotating system.

SUMMARY

In order to solve the above problems, the present application provides a spin coating apparatus and method, an electromagnetic induction device being disposed in the apparatus to produce variable electromagnetic forces for the tilted chuck to maintain balance of the chuck.

To this end, the present application provides a spin coating apparatus comprising a rotatable shaft and a chuck secured at an end portion of the shaft. The shaft is configured to, when rotating, drive the chuck to rotate. An electromagnetic induction device is disposed under the chuck, so that the centrifugal force generated by the rotation of the chuck is brought in balance with magnetic force generated by the electromagnetic induction device to adjust surface levelness of the chuck.

Preferably, the electromagnetic induction device may comprise an annular magnet fixed to a lower surface of the chuck, one or more magnetic bars secured to the shaft and one or more coil groups disposed between the annular magnet and the one or more magnetic bars.

Preferably, at least two coil groups are provided, which are uniformly distributed around the shaft.

Preferably, each of the coil groups comprises a first coil which is able to, when electrically powered, produce a magnetic force that interacts with the annular magnet; and a second coil configured to produce an electromagnetic induction with the one or more magnetic bars, wherein the first coil and the second coil in each of the coil groups are electrically coupled.

Preferably, at least one of the coil groups may is disposed in positional correspondence with a notch of a substrate supported on the chuck, and wherein the first coil of a coil group that is disposed in positional correspondence with the notch of the substrate supported on the chuck has an opposite polarity to a portion of the annular magnet and the second coil of the coil group that is disposed in positional correspondence with the notch of the substrate supported on the chuck has an opposite polarity to a corresponding one of the magnetic bars.

Preferably, the one or more coil groups may be fixed to a holder.

Preferably, eight coil groups may be provided, wherein the eight coil groups are uniformly distributed around the shaft.

The present application also provides a spin coating method using the spin coating apparatus as defined above, comprising providing a substrate to be coated on a chuck; and upon rotation of the chuck driven by a shaft and upon a correspondingly generated centrifugal force causing different portions of the chuck to have different heights, exerting by an electromagnetic induction device a repulsive force to a portion of the chuck having a smaller height and an attractive force to another portion of the chuck having a greater height to adjust a surface levelness of the chuck.

Compared with the prior art, the present application offers the following advantages: it provides a spin coating apparatus and method, the apparatus comprising a rotatable shaft and a chuck secured at an end portion of the shaft, an electromagnetic induction device being disposed under the chuck. During rotation, if the surface of the chuck tilts relative to a horizontal plane due to a non-uniform centrifugal force distribution, changes will occur in a positional relationship ship between the chuck and the electromagnetic induction device disposed thereunder, resulting in changes of the electromagnetic forces from the electromagnetic induction device. In response, the repulsive force and attractive electromagnetic force exerted on different portions of the chuck will change accordingly, thereby compensating for the unbalanced centrifugal forces and maintaining balance of the chuck. The spin coating apparatus and method provided in the present application only need to configure the electromagnetic induction device without the demand of the human control, allowing to automatically adjust the repulsive force and attractive force. Thus, the chuck is able to rotate more stably with a reduced wobbling and an enhanced photoresist coating quality as well as allows to save time and effort.

In these figures, 1-substrate; 2-chuck; 3-shaft; 4-annular magnet; 5-first coil; 6-second coil; and 7-magnetic bar.

DETAILED DESCRIPTION

To make the objects, advantages and features of the present invention more clear, the embodiments of the present invention will be described in greater detail below with reference to accompanying figures.

Figure 1:
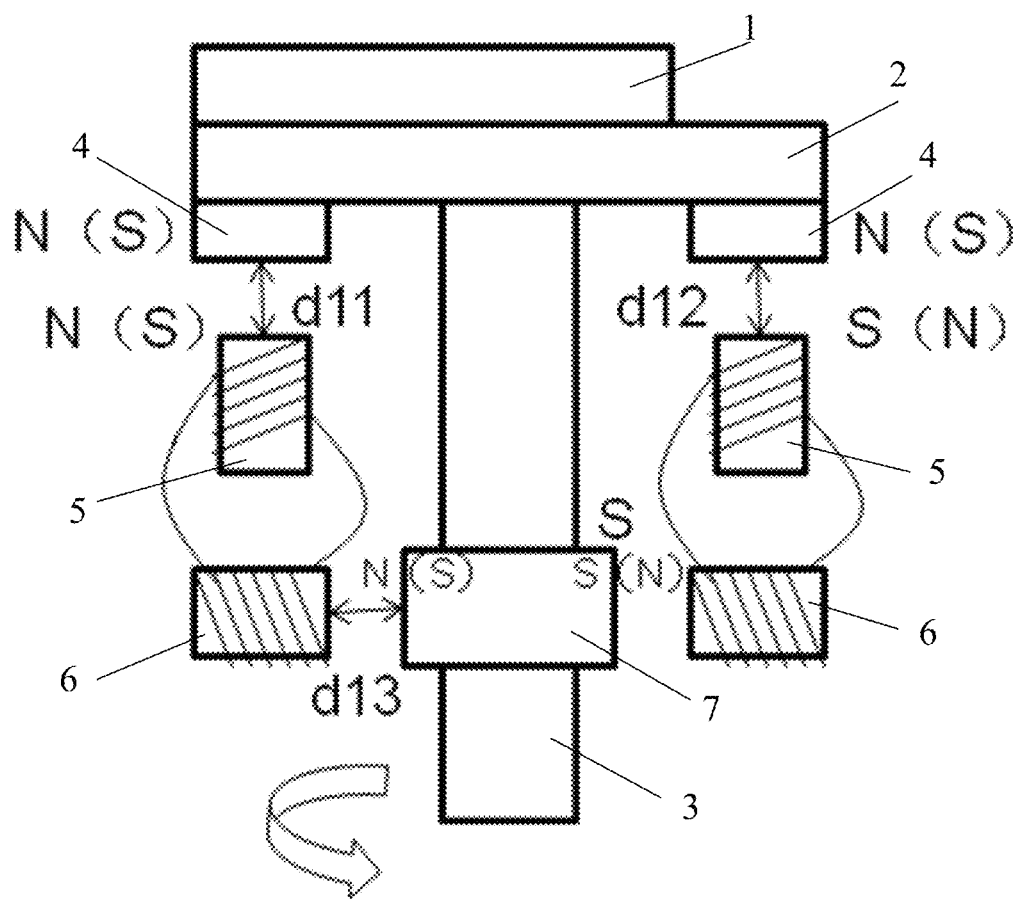
FIG. 1 is a structural schematic of a spin coating apparatus according to an embodiment of the present application.

Referring to FIG. 1, the present application provides a spin coating apparatus including a rotatable shaft 3 and a chuck 2 secured to an end portion of the shaft 3. The shaft 3 is generally connected to a driving means such as an electric motor, which drives the shaft 3 to rotate about its own axis. As a result, the chuck 2 rotates with the rotation of the shaft 3.

Figure 2:
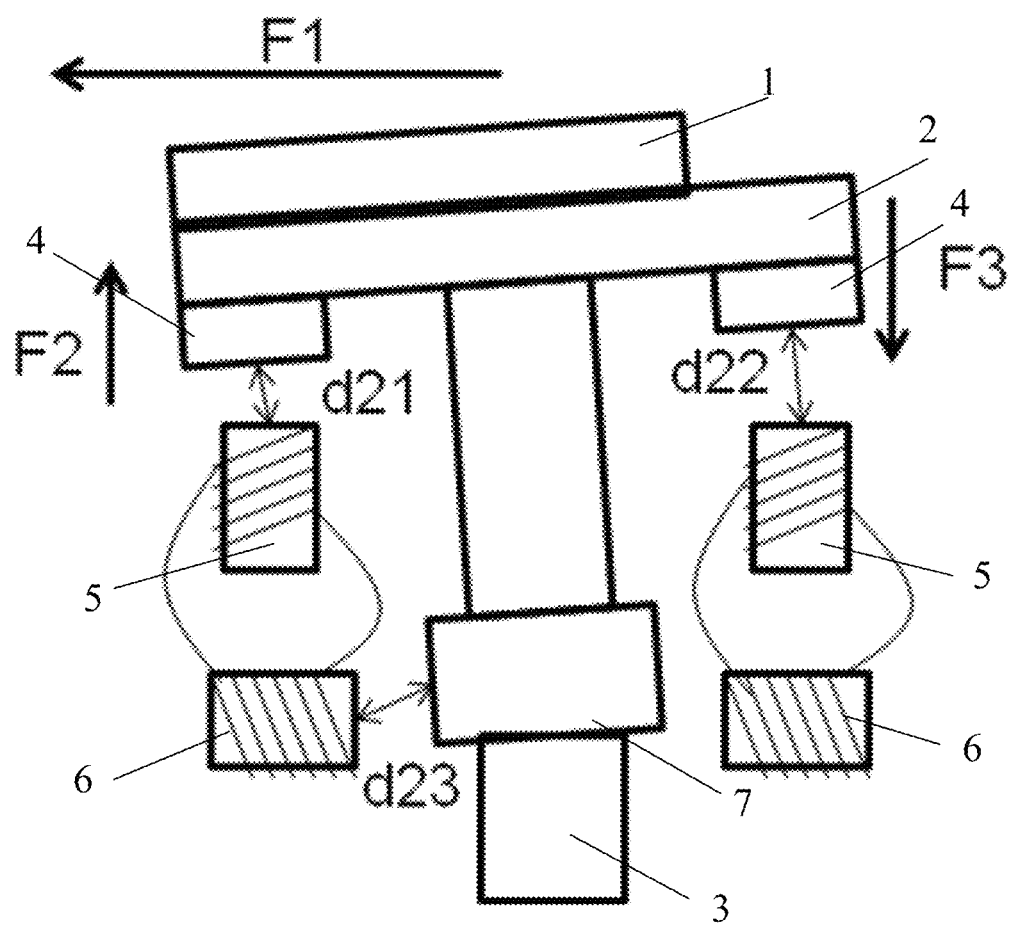
FIG. 2 is a process schematic of the balance maintenance of the spin coating apparatus according to an embodiment of the present application.

Referring to FIG. 2, a substrate 1 is placed on the chuck 2. Generally, the chuck 2 and the substrate 1 are both circular. If the substrate 1 having a center of gravity that is not coincident with its geometric center (GC), such as a sapphire substrate for fabricating LED chips that usually has a flat notch, is placed on the chuck 2, the geometric center of the substrate 1 needs to be in coincidence with the geometric center of the chuck 2. In this case, when the substrate 1 rotates with the chuck 2, a common center of gravity of the chuck 2 and the substrate 1 is offset from the axial center of the shaft 3, which results in an unbalanced centrifugal force F1. Specifically, the portion of the chuck 2 supporting a heavier part of the substrate 1 will experience a greater centrifugal force, and the portion of the chuck 2 supporting a lighter part of the substrate 1 will experience a smaller centrifugal force. For this reason, the chuck 2 will wobble, with its portion supporting the substrate's heavier part going down and the portion supporting the substrate's lighter part going up.

The spin apparatus provided in the present application is disposed with an electromagnetic induction device including: one or more magnetoelectric elements, each configured to generate an electromotive force from the relative movement between a magnet and a coil; and one or more electromagnetic elements, each configured to generate a magnetic field when an electric current is flowed through.

The electromagnetic induction device may include, arranged from up to down:

an annular magnet 4 fixed under the chuck 2. The annular magnet 4 may be arranged along the circumference of the chuck 2 continuously or non-continuously, i.e. the annular magnet 4 may include several ring segments that are preferred to be distributed uniformly along the circumference of the chuck 2;

a coil group, comprising, from up to down, a first coil 5 and a second coil 6 electrically coupled to the first coil 5;

a magnetic bar 7 secured to the shaft 3. The magnetic bar 7 may either be fixed to the circumferential surface of the shaft 3 or extend transversely through the shaft 3. In the case that the magnetic bar 7 is fixed to the circumferential surface of the shaft 3, the two end portions of the magnetic bar 7 may be joined to magnetic bar form an annulus surrounding the shaft 3. In the case that the magnetic bar 7 extends transversely through the shaft 3 (with two end portions thereof protruding out of the circumferential surface of the shaft 3), a plurality of magnetic bars 7 extending transversely through the shaft 3 are arranged at a same height of magnetic bar the shaft 3 so that the end portions of the plurality of magnetic bars 7 are distributed uniformly along the circumferential surface of the shaft 3 at the same height.

The magnetic bar 7 and the second coil 6 may form a magnetoelectric element, while the first coil 5 may form an electromagnetic element. Additionally, the first coil 5 may face toward (partial surface of) the annular magnet 4, while the second coil 6 may face toward (partial surface of) the magnetic bar 7.

Figure 3:
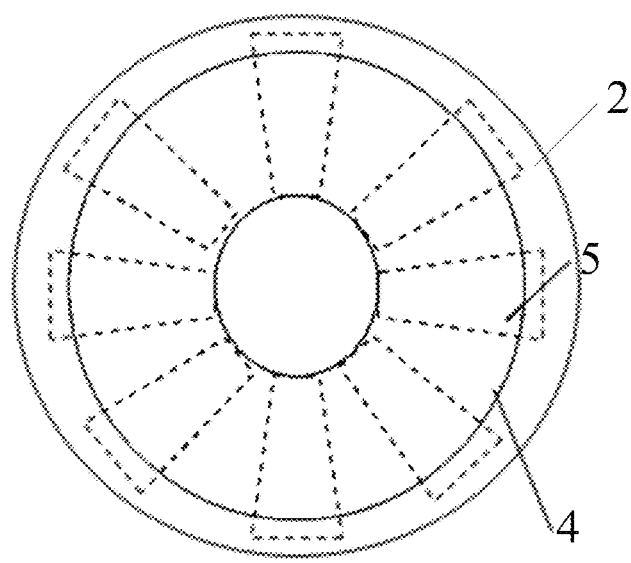
FIG. 3 is a top view of FIG. 1.

Referring to FIG. 3, in the above electromagnetic induction device, a plurality of coil groups may be provided uniformly around the shaft 3. The first coil 5 may produce a magnetic field when electrically powered. The polarity of the magnetic field produced at an end surface of the electrically powered first coil 5 can be determined by a winding direction of the first coil 5.

Referring to FIG. 1 to FIG. 3, at the portion of the chuck 2 supporting the lighter part of the substrate 1, i.e. the portion corresponding to the notch of the substrate 1, the two opposing surfaces of a portion of the annular magnet 4 and the first coil 5 disposed under the said portion of the chuck 2 exhibit opposing polarities, and the two opposing surfaces of the second coil 6 corresponding to the first coil 5 and the end portion of the corresponding magnetic bar 7 exhibit opposing polarities. With this arrangement, an attractive force F3 is generated between the portion of the annular magnet 4 located at the portion of the chuck 2 corresponding to the notch of the substrate 1 and the first coil 5 disposed under the said portion of the chuck 2, so as to descend the upward portion of the chuck 2 to make the chuck 2 approach the level.

At the portion of the chuck 2 supporting the heavier part of the substrate 1, the two opposing surfaces of a portion of the annular magnet 4 and the first coil 5 disposed under the said portion of the chuck 2 exhibit a same polarity, and the two opposing surfaces of the second coil 6 corresponding to the first coil 5 and the end portion of the corresponding magnetic bar 7 exhibit a same polarity. With this arrangement, a repulsive force F2 is generated between the portion of the annular magnet 4 located at the portion of the chuck 2 supporting the heavier part of the substrate 1 and the first coil 5 under the said portion of the chuck, so as to raise the downward portion of the chuck 2 to make the chuck 2 approach the level.

The polarities of the coils in the above coil groups may be determined by winding directions of the coils. The coil groups may be fixed to a circumferential holder so as not to physically contact the shaft 3 and chuck 2. For example, a plurality of coil groups may be fixed to an annular holder surrounding the shaft 3. Additionally, the annular holder may be disposed coaxially with the shaft 3.

Referring to FIG. 1 and FIG. 2, the present application also provide a spin coating method using the spin coating apparatus as defined above, specifically comprising that:

A substrate 1 to be coated is placed onto the chuck 2, the substrate 1 having a notch (not shown); When the chuck 2 rotates under the drive of the shaft 3, the portion of the chuck 2 supporting the heavier part of the substrate 1 goes downward to decrease the distance from the said portion to the corresponding first coil 5 (the distance is shown to decrease from d11 to d21). As a result, the shaft 3 inevitably deforms with the above deformation of the chuck 2 to tilt towards the portion of the chuck 2 supporting the heavier part of the substrate 1, thereby decreasing the distance from the magnetic bar 7 to the second coil 6 (from d13 to d23 as shown). In this case, an electromotive force of the second coil 6 is increased and hence a current flowing therein is increased. Since the second coil 6 is electrically coupled to the first coil 5, the first coil 5 also experience a current increase, which intensifies a magnetic field between the first coil 5 and the annular magnet 4 at this portion and augments the magnetic force between the first coil 5 and the annular magnet 4 at this portion. Since the opposing surfaces of the first coil 5 and the annular magnet 4 at this portion have a same polarity, the first coil 5 exerts a more strongly repel force on the annular magnet 4, and thus push the said portion of the chuck 2 upward.

At the same time, the portion of the chuck 2 supporting the lighter part of the substrate 1 goes upward to increase the distance from the said portion to the corresponding first coil 5 (as shown, the distance increases from d12 to d22). Since the opposing surfaces of the first coil 5 and the annular magnet 4 at this portion have opposite polarities, the first coil 5 exerts an attractive force on the magnetic force. Therefore, although this portion of the chuck 2 is upward, the attractive force will pulls this portion of the chuck 2 downward to maintain the balance of the chuck 2 eventually.

To sum up, the electromagnetic induction device provided in the present application is able to generate a repulsive force to push the portion of the chuck 2 supporting the heavier part of the substrate 1 upward and an attractive force to pull the portion of the chuck 2 supporting the lighter part of the substrate 1 downward, so as to allow to maintain mechanical balance of the chuck 2 during its rotation. As a result, the chuck 2 is less likely to wobble, and the risk of causing damage to the equipment is able to be lowered.

Figure 4:
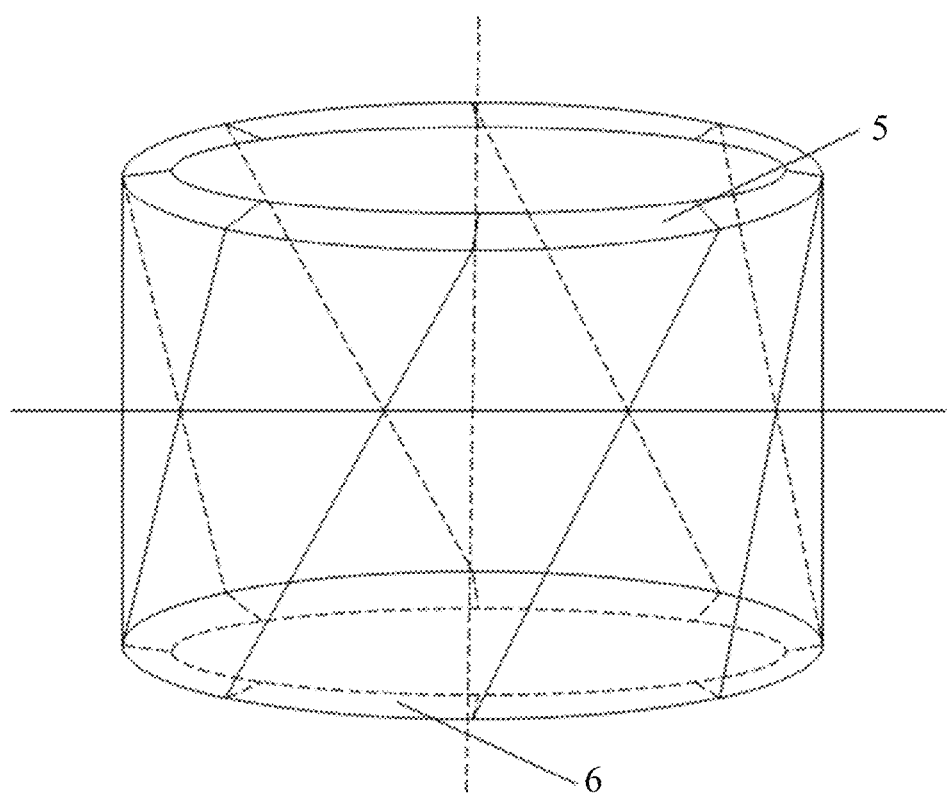
FIG. 4 is a structural schematic of a coil group according to an embodiment of the present application.

Referring to FIG. 4, an inductive impedance of a coil can lead to a time delay in the response of a corresponding magnetic field, also known as hysteresis. This can be eliminated by reducing the distances between the second coils 6 and the first coils 5 or the distances between the second coils 6 and the magnetic bars 7.

The present application provides a spin coating apparatus and method, the apparatus comprising a rotatable shaft 3 and a chuck 2 secured at an end portion of the shaft 3, an electromagnetic induction device being disposed under the chuck 2. During rotation, if the surface of the chuck tilts relative to (i.e., becomes non-parallel to) a horizontal plane due to a non-uniform centrifugal force distribution, changes will occur in a positional relationship between the chuck 2 and the electromagnetic induction device disposed thereunder, resulting in changes of the electromagnetic forces from the electromagnetic induction device. In response, repulsive and attractive electromagnetic forces exerted on different portions of the chuck will change accordingly, thereby compensating for the unbalanced centrifugal forces and maintaining balance of the chuck. The spin coating apparatus and method provided in the present application only need to configure the electromagnetic induction device without the demand of the human control, allowing to automatically adjust the repulsive force and the attractive force. Thus, the chuck 2 is able to rotate more stably with a reduced wobbling and an enhanced photoresist coating quality, as well as allows saving time and effort.

While the present application has been described above with reference to the foregoing embodiments, it is not limited to these disclosed embodiments. It is apparent that those skilled in the art can make various modifications and variations to the present application without departing from the spirit and scope thereof. Accordingly, the invention is intended to embrace all such modifications and variations if they fall within the scope of the appended claims and equivalents thereof.

What is claimed is:

1. A spin coating apparatus, comprising a rotatable shaft and a chuck secured at an end portion of the shaft, the shaft configured to, when rotating, drive the chuck to rotate, wherein an electromagnetic induction device is disposed under the chuck, so that a centrifugal force generated by a rotation of the chuck is brought in balance with a magnetic force generated by the electromagnetic induction device to adjust a surface levelness of the chuck, wherein the electromagnetic induction device comprises an annular magnet fixed to a lower surface of the chuck, one or more magnetic bars secured to the shaft and one or more coil groups disposed between the annular magnet and the one or more magnetic bars.

2. The spin coating apparatus of claim 1, wherein the electromagnetic induction device comprises one or more electromagnetic elements and one or more magnetoelectric elements coupled to the one or more electromagnetic elements.

3. The spin coating apparatus of claim 2, wherein the electromagnetic element comprises one or more first coils disposed in correspondence with an annular magnet fixed to a lower surface of the chuck, and wherein the magnetoelectric element comprises one or more magnetic bars secured to the shaft and one or more second coils provided in correspondence with the one or more magnetic bars.

4. The spin coating apparatus of claim 1, wherein at least two coil groups are provided, which are uniformly distributed around the shaft.

5. The spin coating apparatus of claim 1, wherein each of the coil groups comprises a first coil which is able to, when electrically powered, produce a magnetic force that interacts with the annular magnet; and a second coil configured to produce an electromagnetic induction with the one or more magnetic bars, wherein the first coil and the second coil in each of the coil groups are electrically coupled.

6. The spin coating apparatus of claim 5, wherein at least one of the coil groups is disposed in positional correspondence with a notch of a substrate supported on the chuck, and wherein the first coil of the coil group that is disposed in positional correspondence with the notch has an opposite polarity to a portion of the annular magnet and the second coil of the coil group that is disposed in positional correspondence with the notch has an opposite polarity to a corresponding one of the magnetic bars.

7. The spin coating apparatus of claim 1, wherein the one or more coil groups are fixed to a holder.

8. The spin coating apparatus of claim 1, wherein eight coil groups are provided, and the eight coil groups are uniformly distributed around the shaft.

9. A spin coating method using the spin coating apparatus as defined in claim 1, comprising:
providing a substrate to be coated on a chuck; and
upon rotation of the chuck driven by a shaft and upon a correspondingly generated centrifugal force causing different portions of the chuck to have different heights, exerting by an electromagnetic induction device a repulsive force to a portion of the chuck having a smaller height and an attractive force to another portion of the chuck having a greater height to adjust a surface levelness of the chuck.

* * * * *